(12) United States Patent
Ju et al.

(10) Patent No.: US 6,232,166 B1
(45) Date of Patent: May 15, 2001

(54) CMOS PROCESSING EMPLOYING ZERO DEGREE HALO IMPLANT FOR P-CHANNEL TRANSISTOR

(75) Inventors: Dong-Hyuk Ju, Cupertino; Scott Luning, San Francisco, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/187,523

(22) Filed: Nov. 6, 1998

Related U.S. Application Data

(63) Continuation-in-part of application No. 08/924,639, filed on Sep. 5, 1999, now Pat. No. 5,972,760.

(51) Int. Cl.⁷ .............................. H01L 21/8238
(52) U.S. Cl. ..................... 438/231; 438/301; 438/527
(58) Field of Search ........................ 438/199, 229, 438/230, 231, 232, 299, 301, 306, 510, 514, 527, 197, 305, 303, 334

(56) References Cited

U.S. PATENT DOCUMENTS

| | | | |
|---|---|---|---|
| 4,111,720 | * | 9/1978 | Michel et al. ............... 438/334 |
| 5,171,700 | * | 12/1992 | Zamanian .................. 438/305 |
| 5,405,791 | * | 4/1995 | Ahmad et al. ............... 438/228 |
| 5,654,218 | * | 8/1997 | Lee .......................... 438/301 |
| 5,719,424 | * | 2/1998 | Ahmad et al. ............... 257/336 |
| 5,736,440 | * | 4/1998 | Manning ..................... 438/232 |
| 5,747,855 | * | 5/1998 | Dennison et al. ............. 257/369 |
| 5,849,615 | * | 12/1998 | Ahmad et al. ............... 438/231 |
| 5,851,866 | * | 12/1998 | Son .......................... 438/231 |
| 5,943,565 | * | 8/1999 | Ju ............................ 438/231 |
| 5,972,760 | * | 10/1999 | Ju ............................ 438/305 |
| 6,017,798 | * | 1/2000 | Iiderem et al. ............. 438/286 |
| 6,037,230 | * | 3/2000 | Holloway ..................... 438/289 |
| 6,051,458 | * | 4/2000 | Liang et al. ................. 438/224 |

OTHER PUBLICATIONS

Su et al.; "Tilt angle effect on optimizing HALO PMOS and NMOS Performance", Electron Devices Meeting, 1997. Proceedings., IEEE Hong Kong, 1997, pp. 11–14.*

Wolf, S., Tauber R.N.; Silicon Processing for the VLSI Era vol. 1: Process Technology, Lattice Press, Sunset Beach, CA, 1986, pp. 161–163, and 182–185.*

* cited by examiner

*Primary Examiner*—John F. Niebling
*Assistant Examiner*—Christopher Lattin

(57) ABSTRACT

Halo implant regions are formed in a P-channel semiconductor device employing a zero degree tilt angle. N-type impurities are ion implanted to the desired depth in the semiconductor substrate prior to forming P-channel lightly doped source/drain areas. Subsequently, moderately or heavily doped source/drain regions are formed, followed by activation annealing. The halo implants diffuse to form halo structures at the desired location, thereby reducing short channel effects, such as subsurface punchthrough. Other embodiments enable independent control of the junction depths and channel lengths of N- and P-channel transistors, while maintaining high manufacturing throughput.

18 Claims, 4 Drawing Sheets

CMOS PROCESSING EMPLOYING ZERO DEGREE HALO IMPLANT FOR P-CHANNEL TRANSISTOR

This application is a continuation-in-part of application Ser. No. 08/924,639, filed Sep. 5, 1997, now U.S. Pat. No. 5,972,760.

CROSS REFERENCE TO THE RELATED APPLICATIONS

The subject matter involved in this application is related to the subject matter involved in commonly-assigned, co-pending application Ser. No. 08/924,640, filed Sep. 5, 1997, now U.S. Pat. No. 5,943,565 issued on Aug. 24, 1999, entitled CMOS PROCESSING EMPLOYING SEPARATE SPACERS FOR INDEPENDENTLY OPTIMIZED TRANSISTOR PERFORMANCE.

1. Technical Field

The present invention relates to a method of manufacturing a semiconductor device with improved reliability and increased manufacturing throughput. The invention has particular applicability in manufacturing high density CMOS semiconductor devices with design features of 0.25 microns and under.

2. Background Art

The escalating requirements for high density and performance associated with ultra large scale integration semiconductor devices require design features of 0.25 microns and under, such as 0.18 microns and under, increased transistor and circuit speeds, high reliability and increased manufacturing throughput. The reduction of design features to 0.25 microns and under challenges the limitations of conventional semiconductor manufacturing techniques.

As design features continually shrink in size, the likelihood of short-channel effects increases. For example, sub-surface punchthrough occurs when the source and drain depletion regions are formed too close to each other, resulting in the generation of a leakage current which adversely affects circuit performance.

A conventional method of preventing subsurface punchthrough in MOSFETs involves the formation of halo implants, as illustrated in FIG. 1. Adverting to FIG. 1, an initial gate dielectric layer 12, such as silicon oxide, is formed on semiconductor substrate 10 and a gate electrode layer formed thereon, as in conventional practices. The gate electrode layer is etched in a conventional manner to form gate electrode 14 on the underlying gate oxide layer 12.

Using gate electrode 14 as a mask, a P-type impurity, such as boron, is implanted as indicated by arrows 16 to form source/drain implants 18. Subsequent to the formation of source/drain implants 18, an N-type impurity is implanted to form halo implant regions 19, to avoid short-channel effects characteristic of P-type transistors.

A drawback attendant upon the formation of halo implant regions 19 is that a large-angle tilt implant is required to implant the N-type impurity to the required lateral penetration and depth. Typically, an N-type impurity such as phosphorous is implanted at an angle greater than 30°, as indicated by arrows 20. The large-angle tilt implant is typically performed twice to complete halo implant regions 19, requiring rotation of semiconductor 10 between segments. In certain semiconductor structures in which gates are oriented at right angles to other gates, four separate large-angle tilt implants are required to form the halo implant regions, requiring four rotations of semiconductor 10. Such processing is time consuming, thereby significantly reducing manufacturing throughput and increasing production costs.

Accordingly, there exists a need for methodology in forming semiconductor devices with significantly reduced susceptibility to short-channel effects while maintaining high manufacturing throughput.

SUMMARY OF THE INVENTION

An object of the present invention is a method of manufacturing a semiconductor device with halo implants in an efficient, cost-effective manner.

Additional objects, advantages and other features of the invention will be set forth in part in the description which follows and in part will become apparent to those having ordinary skill in the art upon examination of the following or may be learned from the practice of the invention. The objects and advantages of the invention may be realized and obtained as particularly pointed out in the appended claims.

According to the present invention, the foregoing and other objects are achieved in part by a method of manufacturing a P-channel CMOS semiconductor device. The method includes forming a dielectric layer on a surface of a semiconductor substrate and forming a conductive layer on the dielectric layer. The method also includes patterning the conductive layer to form a gate electrode having an upper surface and side surfaces. The method further includes implanting N-type impurities at a zero degree tilt angle to form halo implant regions in the semiconductor substrate.

Another aspect of the invention is a method of manufacturing a CMOS semiconductor device comprising an N-channel transistor and P-channel transistor. The method includes forming a dielectric layer on a surface of a semiconductor substrate and forming a conductive layer on the dielectric layer. The method also includes patterning the conductive layer to form a first gate electrode of the N-channel transistor and a second gate electrode of the P-channel transistor, each gate electrode having an upper surface and side surfaces. The method further includes using the first gate electrode as a mask and implanting N-type impurities to form N-type lightly doped implant regions of the N-channel transistor in the semiconductor substrate. The method also includes using the second gate electrode as a mask and implanting N-type impurities at a zero degree tilt angle to form halo implant regions of the P-channel transistor in the semiconductor substrate.

Other objects and advantages of the present invention will become readily apparent to those skilled in this art from the following detailed description. The embodiments shown and described provide illustration of the best mode contemplated for carrying out the invention. The invention is capable of modifications in various obvious respects, all without departing from the invention. Accordingly, the drawings and description are to be regarded as illustrative in nature, and not as restrictive.

BRIEF DESCRIPTION OF THE DRAWINGS

Reference is made to the attached drawings, wherein elements having the same reference numeral designations represent like elements throughout.

DETAILED DESCRIPTION OF ILLUSTRATED EMBODIMENTS

The present invention provides methodology enabling the manufacture of semiconductor devices exhibiting significantly reduced susceptibility to short channel effects while achieving high production throughput. In accordance with the present invention, halo implant regions are formed at zero degree tilt angles, thereby reducing the number of process steps and saving manufacturing time vis-à-vis conventional practices employing large angle tilt implants.

The present invention also provides methodology enabling control of the junction depth ($X_J$) of a P-channel transistor independently of the $X_J$ of an N-channel transistor and provides greater independent control of the respective lengths of the channel regions of the P-channel and N-channel transistors.

Figure 1:
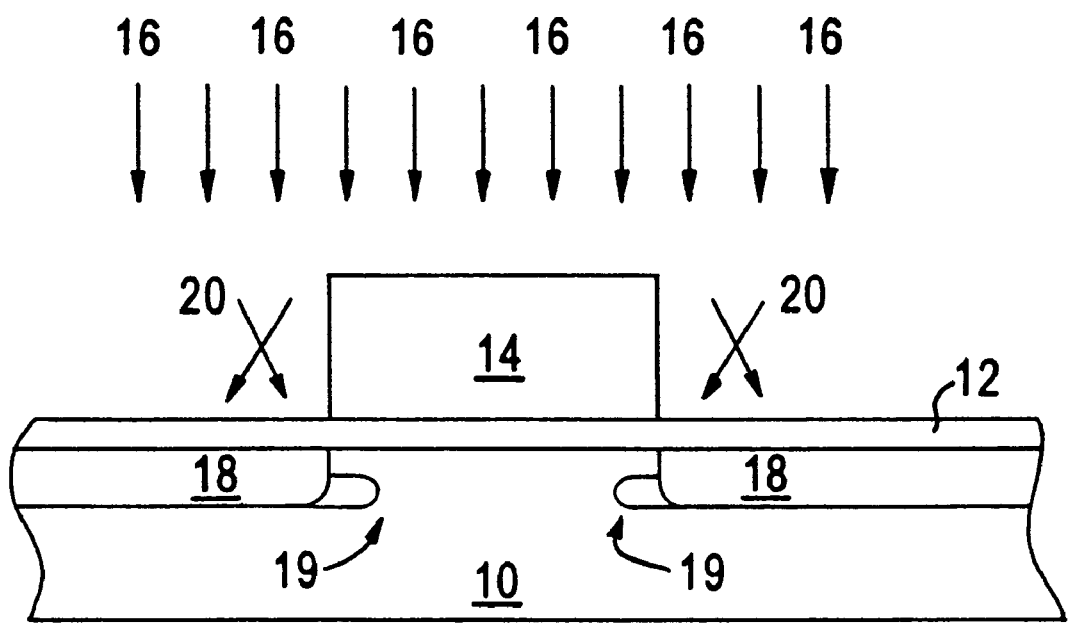
FIG. 1 illustrates conventional methodology for forming halo implants.
Figure 2A:
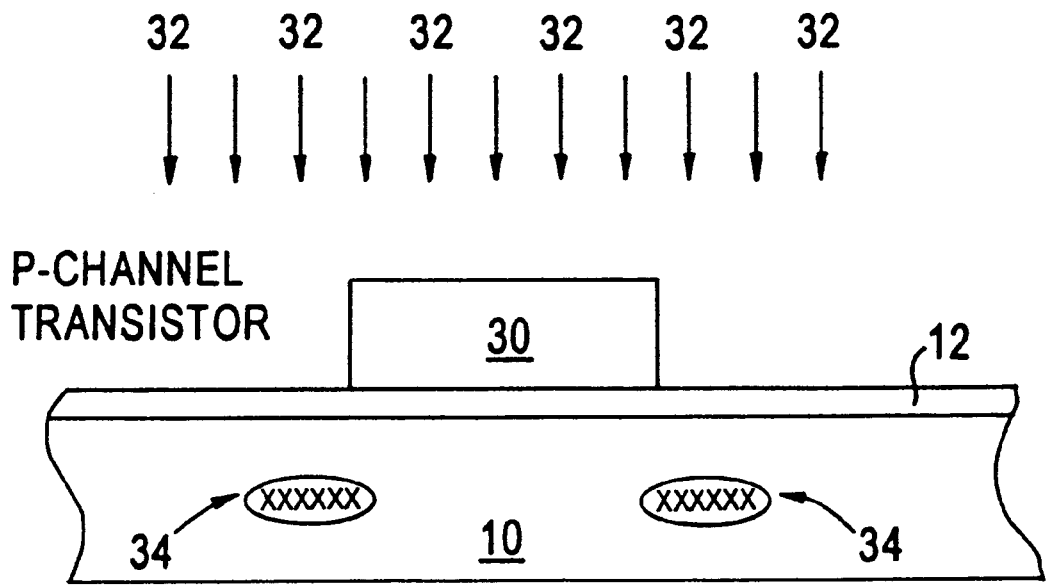
FIGS. 2A, 2B and 2C illustrate the formation of P-channel transistors according to an embodiment of the present invention.
Figure 2B:
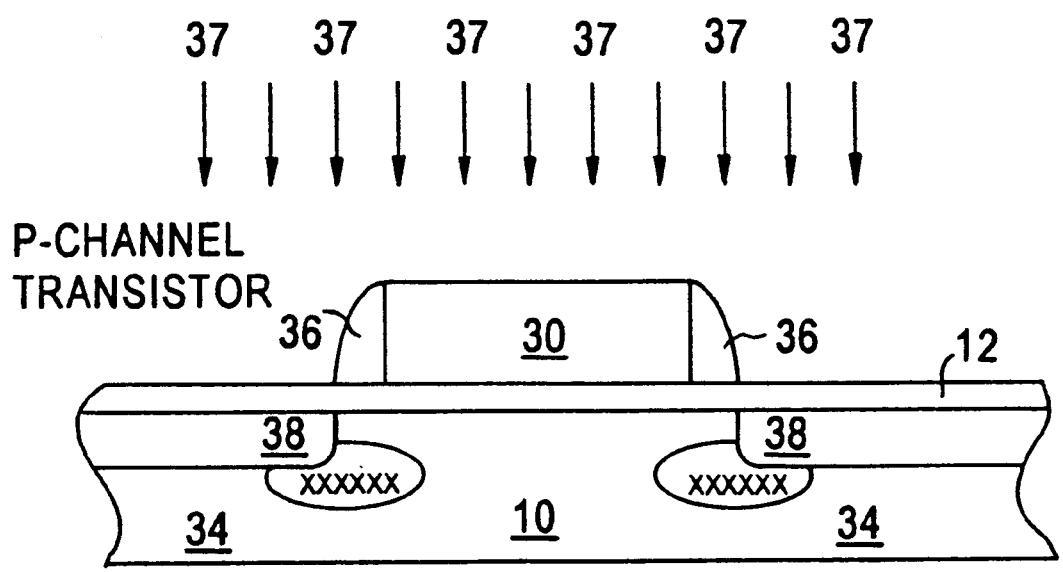
Figure 2C:
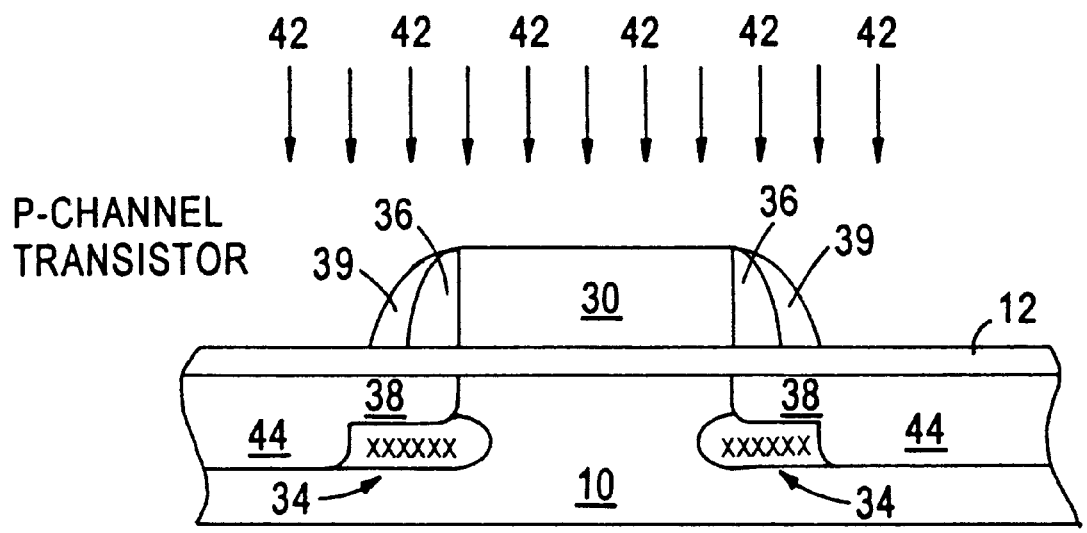

An embodiment of the present invention is schematically illustrated in FIGS. 2A through 2C. Adverting to FIG. 2A, a gate dielectric layer 12, such as silicon oxide, is formed on semiconductor substrate 10, typically comprising doped monocrystalline silicon. A conductive layer, e.g., doped polycrystalline silicon, is deposited on gate oxide layer 12 and patterned in a conventional manner to form gate electrode 30 of the P-channel transistor.

The present invention departs from conventional methodology by forming halo implant regions for the P-channel transistor prior to forming lightly doped source/drain (LDD) implants. Using gate electrode 30 as a mask, an N-type impurity is ion implanted at a substantially zero degree tilt angle, i.e., in a direction substantially perpendicular to the upper surface of the substrate, as indicated by arrows 32, to form halo implant regions 34. Such halo implant regions 34 eliminate short-channel effects, such as punchthrough, and optimize P-channel transistor performance. The particular implantation depth and dosage depend on the particular design requirements, giving due consideration to both lateral and vertical diffusion of the implanted impurity during various subsequent manufacturing processing steps, e.g., activation annealing. Given the objectives disclosed herein, the particular implantation dosage and energy can be optimized in a particular situation.

For example, an N-type impurity such as phosphorous may be implanted at a dosage of about $5 \times 10^{12}$ atoms/cm$^2$ to about $5 \times 10^{13}$ atoms/cm$^2$ and an implantation energy of about 40 KeV to about 60 KeV to form halo implant regions 34. Alternatively, another N-type impurity, such as arsenic, may be implanted at a dosage and implantation energy based on the particular design requirements.

Advantageously, ion implanting impurities at a zero degree tilt angle to form halo regions 34 conserves considerable manufacturing time associated with performing large angle tilt implants. As discussed previously, in conventional halo region formation, the semiconductor must be rotated as many as four times to form the halo regions. By ion implanting the N-type impurities at a zero degree tilt angle, the present inventive methodology saves significant processing time associated with rotating the semiconductor as well as performing multiple implants.

Additionally, implanting the N-type impurities before the formation of the source/drain regions enables the implanted impurity to be implanted with a lower implantation energy. That is, since the N-type impurities diffuse both vertically and laterally to the desired location during subsequent processing steps, the implantation depth may be reduced and, hence, the requisite implantation energy is reduced accordingly.

After forming halo implant regions 34, a layer of insulating material, such as a silicon oxide, a silicon nitride or a silicon oxynitride, is deposited, e.g., by chemical vapor deposition (CVD), at a suitable thickness for forming sidewall spacers. Next, the insulating material is anisotropically etched to form sidewall spacers 36 on the side surfaces of gate electrode 30, as shown in FIG. 2B. The sidewall spacers are formed at a targeted width to achieve a desired channel length, giving due consideration for diffusion during subsequent processing steps. For example, it has been found suitable to form sidewall spacers 36 having a width of about 300 Å to about 500 Å. Anisotropic etching can be performed so that a portion of the underlying gate dielectric layer 12 remains to serve as an oxide screen for subsequent moderate or heavy ion implantations. Alternatively, a thermal oxide screen layer can be grown or, preferably, vapor deposited, as disclosed in copending application Ser. No. 08/924,639, filed Sep. 5, 1997, now U.S. Pat. No. 5,972,760 issued on Oct. 26, 1999, to minimize transient enhanced diffusion of implanted impurities.

Adverting to FIG. 2B, P-type impurities are then implanted, as indicated by arrows 37, using gate electrode 30 and sidewall spacers 36 as a mask, to form P-type lightly doped source/drain (LDD) implants 38 in semiconductor substrate 10. Subsequently, second sidewall spacers 39, having a predetermined width, are formed on first sidewall spacers 36, as shown in FIG. 2C, in a manner similar to forming first sidewall spacers 36, e.g., CVD of a silicon oxide, a silicon nitride or a silicon oxynitride film followed by anisotropic etching. As in forming the first sidewall spacers, anisotropic etching can be performed so that a portion of underlying gate dielectric layer 12 remains to serve as an oxide screen for subsequent moderate or heavy ion implantations. Alternatively, a thermal oxide screen layer can be grown or, preferably vapor deposited, as discussed above, to minimize transient enhanced diffusion of implanted impurities. The width of second sidewall spacers 39 is also selected to achieve a desired channel length of the P-channel transistor to minimize short channel effects, giving due consideration for diffusion during subsequent processing steps. For example, it has been found suitable to form second sidewall spacers 39 having a width of about 500Å to about 1000 Å.

After forming second sidewall spacers 39, P-type impurities are ion implanted, as indicated by arrows 42, utilizing gate electrode 30, first sidewall spacers 36 and second sidewall spacers 39 as a mask, to form moderately doped source/drain (MDD) or heavily doped source/drain (HDD) implant regions 44. In practicing the present invention, the dosages and energies of P-type impurity ion implantations are selected for optimum P-channel transistor performance, notably achieving an optimal $X_J$ of less than 1500 Å A, e.g., about 1200 Å. For example, P-type impurities, such as $BF_2$, are typically ion implanted at a dosage of about $2 \times 10_{15}$ atoms/cm$^2$ to about $4 \times 10^{15}$ atoms/cm$^2$ and at an energy of about 20 KeV to about 40 KeV to form the MDD/HDD implant regions 44. Activation annealing is then conducted at a temperature of about 900° to about 1000° C. for about 10 seconds to about 45 seconds, e.g., 30 seconds, to activate the source/drain regions of the P-channel transistor.

The resulting semiconductor structure illustrated in FIG. 2C advantageously reduces subsurface punchthrough via the formation of halo implant regions 34. Additionally, the strategic formation of sidewall spacers on the side surfaces of gate electrode 30 optimizes the channel length and $X_J$ of the P-channel transistor.

Figure 3A:
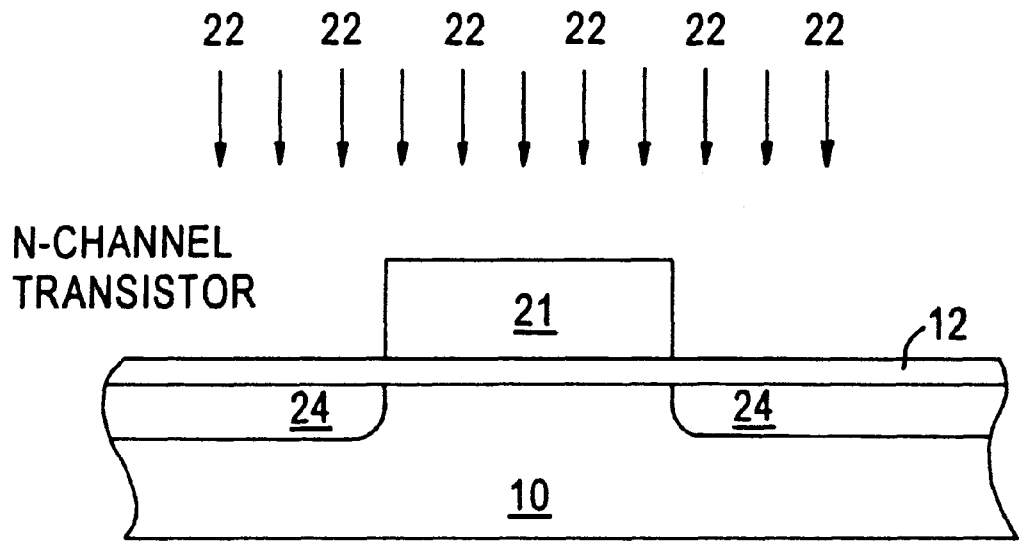
FIGS. 3A and 3B illustrate the formation of N-channel transistors according to an embodiment of the present invention.
Figure 3B:
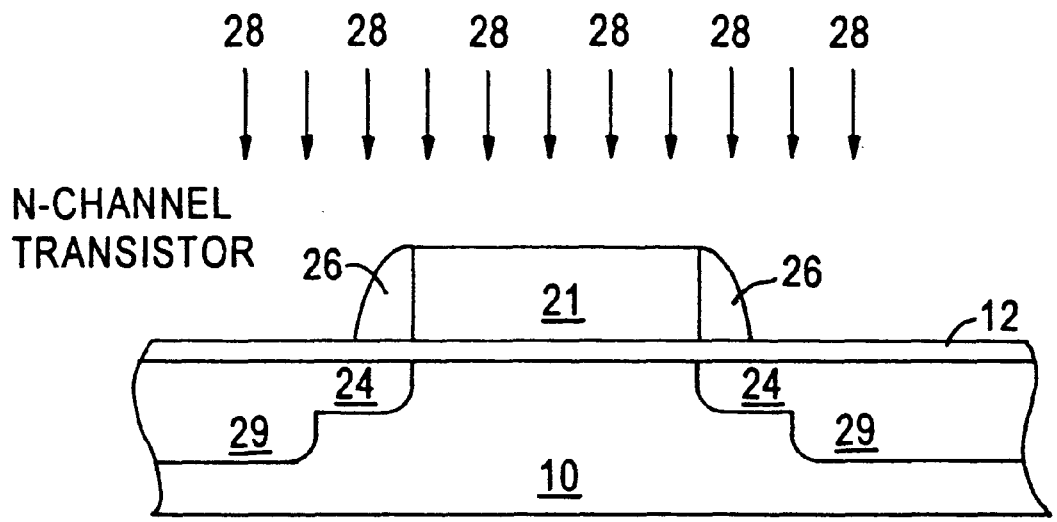

In accordance with another embodiment of the present invention illustrated in FIGS. 3A and 3B, in conjunction with FIGS. 2A–2C, halo implant regions in a P-channel transistor are formed using zero degree tilt angle halo implants as described above. Additionally, in order to reduce the number of manufacturing steps in forming semiconductor devices, the present invention provides methodology for efficiently forming both N-channel and P-channel transistors. The inventive methodology forms the source/drain regions of the P-channel and N-channel transistors independently, thereby enabling independent optimization of the N-channel and P-channel transistors, particularly the channel length and $X_J$ of the P-channel transistor. This independent optimization of the N-channel and P-channel transistors is achieved by the strategic formation of sidewall spacers on the side surfaces of the gate electrodes of the N-channel and P-channel transistors.

Adverting to FIG. 3A, a gate dielectric layer 12, such as silicon oxide, is formed on semiconductor substrate 10, typically comprising doped monocrystalline silicon. A conductive layer, e.g., doped polycrystalline silicon, is deposited on gate oxide layer 12 and patterned in a conventional manner to form gate electrode 21 of the N-channel transistor (FIG. 3A) and gate electrode 30 of the P-channel transistor (FIG. 2A).

Next, the P-channel transistor region is masked and N-channel impurities are ion implanted, as indicated by arrows 22 in FIG. 3A, using gate electrode 21 as a mask to form N-type LDD implants 24 in semiconductor substrate 10. Implantation is conducted at a dosage and energy to optimize N-channel transistor performance, giving consideration for both lateral and vertical diffusion of the implants. For example, N-type impurities, such as arsenic, may be implanted at a dosage of about $5 \times 10^{14}$ atoms/cm$^2$ to about $2 \times 10^{15}$ atoms/cm$^2$ and an implantation energy of about 10 KeV to about 20 KeV to form the LDD implants of an N-channel MOSFET. Alternatively, another N-type impurity, such as phosphorous, may be implanted at a dosage and implantation energy based on the particular design requirements.

The present invention departs from conventional methodology by forming halo implant regions for the P-channel transistor, subsequent to the N-channel LDD implant. While maintaining the N-channel transistor region masked and using gate electrode 30 as a mask, an N-type impurity is ion implanted at a zero degree tilt angle, as indicated by arrows 32 in FIG. 2A, to form halo implant regions 34. As discussed previously in connection with FIG. 2A, implantation is conducted to eliminate short-channel effects such as punch-through and optimize P-channel transistor performance. The particular implantation depth and dosage depend on the particular design requirements, giving due consideration for subsequent lateral and vertical diffusion.

For example, an N-type impurity such as phosphorous may be implanted at a dosage of about $5 \times 10^{12}$ atoms/cm$^2$ to about $5 \times 10^{13}$ atoms/cm$^2$ and an implantation energy of about 40 KeV to about 60 KeV to form halo implant regions 34. Alternatively, another N-type impurity, such as arsenic, may be implanted at a dosage and implantation energy based on the particular design requirements.

As discussed previously, in conventional halo region formation, the semiconductor must be rotated between segments, up to four times, to form the halo regions. By ion implanting the N-type impurities at a zero degree tilt angle, the present inventive methodology saves significant processing time associated with rotating the semiconductor as well as performing multiple implants. Additionally, as discussed previously, implanting the N-type impurities before the formation of the source/drain regions enables the implanted impurity to be implanted at a lower implantation energy.

After forming halo implant regions 34, a layer of insulating material, such as a silicon oxide, a silicon nitride or a silicon oxynitride, is deposited, e.g., by chemical vapor deposition (CVD) at a suitable thickness for forming sidewall spacers. Next, the insulating material is anisotropically etched to form sidewall spacers 26 on the side surfaces of gate electrode 21, as shown in FIG. 3B, and to form first sidewall spacers 36 on the side surfaces of gate electrode 30, as shown in FIG. 2B. The sidewall spacers are formed at a targeted width to achieve the desired channel length, giving due consideration for diffusion during subsequent processing steps. For example, it has been found suitable to employ sidewall spacers 26 and 36 having a width of about 3 00Å to about 500 Å. Anisotropic etching can be performed so that a portion of the underlying gate dielectric layer 12 remains to serve as an oxide screen for subsequent moderate or heavy ion implantations. Alternatively, a thermal oxide screen layer can be grown or, preferably, vapor deposited to minimize transient enhanced diffusion of implanted impurities.

Adverting to FIG. 3B, while maintaining the P-channel region masked, N-type impurities are ion implanted, as indicated by arrows 28, using gate electrode 21 and sidewall spacers 26 as a mask, to form N-channel MDD or HDD implants 29. The implantation dosages and energies employed in forming the N-channel MDD/HDD implants are optimized for N-channel transistor performance. For example, N-type impurities, such as arsenic, are typically implanted at a dosage of about $3 \times 10^{15}$ atoms/cm$^2$ to about $6 \times 10^{15}$ atoms/cm$^2$ and at an energy of about 30 KeV to about 60 KeV to form the MDD/HDD implants 29 of an N-channel MOSFET. Alternatively, another N-type impurity, such as phosphorous, may be implanted at a dosage and implantation energy based on the particular design requirements.

After forming the N-channel MDD/HDD implant regions 29, activation annealing is conducted, such as rapid thermal annealing (RTA), at a temperature of about 900° C. to about 1100° C. for about 30 seconds to activate the LDD and MDD/HDD implants to form the source/drain regions of the N-channel transistor.

Adverting to FIG. 2B, after activating the N-channel transistor source/drain regions, the N-channel transistor region is masked and P-type impurities are implanted, as indicated by arrows 37, using gate electrode 30 and sidewall spacers 36 as a mask, to form P-type LDD implants 38 in semiconductor substrate 10. Subsequently, second sidewall spacers 39 having a predetermined width, are formed on first sidewall spacers 36, as shown in FIG. 2C, in a manner similar to forming first sidewall spacers 36, e.g., CVD of a silicon oxide, a silicon nitride or a silicon oxynitride film followed by anisotropic etching. After forming second sidewall spacers 39 on P-channel transistor gate electrode 30, P-type impurities are ion implanted, as indicated by arrows 42, utilizing gate electrode 30, first sidewall spacers 36 and second sidewall spacers 39 as a mask, to form MDD or HDD implant regions 44. In practicing the present invention, the dosages and energies of P-type impurity ion implantations are selected for optimum P-channel transistor performance, notably $X_J$. For example, P-type impurities are typically ion implanted at a dosage of about $2 \times 10^{15}$ atoms/cm$^2$ to about $4\times10^{15}$ atoms/cm$^2$ and at an energy of about 20 KeV to about 40 KeV to form the MDD/HDD implant regions 44. Activation annealing is then conducted at a temperature of about 900° to about 1000 C. for about 10 seconds to about 45 seconds, e.g., 30 seconds, to activate the source/drain regions of the P-channel transistor.

The present invention enables optimization of the channel length and Xj of the P-channel transistor without being tied to processing conditions required to optimize performance of the N-channel transistor. The present invention provides a wide degree of selectivity for the width of the sidewall spacers. In accordance with the present invention, the $X_J$ for the P-channel transistor can be controlled to a depth of about 500 Å to about 800 Å, e.g., less than about 800 Å, without compromising the optimum performance characteristics of the N-channel transistor.

Thus, in accordance with the present invention, the halo implant regions increase P-channel transistor reliability while maintaining high manufacturing throughput. Additionally, in accordance with the invention, the performance of the N-channel transistor and P-channel transistor are optimized independently, particularly the channel length and the $X_J$ of the P-channel transistor, while maintaining optimum N-channel transistor performance. Implantation dosages and activation annealing conditions are selected for independent optimization for the N-channel transistor and P-channel transistor. The present invention is applicable to the production of various types of semiconductor devices, particularly high density semiconductor devices with submicron features of about 0.25 microns and below, exhibiting high speed characteristics and improved reliability. The present invention is cost effective and can easily be integrated into conventional processing.

In the previous descriptions, numerous specific details are set forth, such as specific materials, structures, chemicals, processes, etc., in order to provide a thorough understanding of the present invention. However, as one having ordinary skill in the art would recognize, the present invention can be practiced without resorting to the details specifically set forth. In other instances, well known processing structures have not been described in detail, in order not to unnecessarily obscure the present invention.

Only the preferred embodiments of the invention and but a few examples of its versatility are shown and described in the present disclosure. It is to be understood that the invention is capable of use in various other combinations and environments and is capable of changes or modifications within the scope of the inventive concept as expressed herein.

What is claimed is:

1. A method of manufacturing a P-channel transistor of a CMOS semiconductor device comprising:
   forming a dielectric layer on a surface of a semiconductor substrate;
   forming a conductive layer on the dielectric layer;
   patterning the conductive layer to form a gate electrode having an upper surface and side surfaces;
   implanting N-type impurities at a zero degree tilt angle to form halo implant regions in the semiconductor substrate;
   depositing a first insulating laver after forming the halo implant regions; etching the first insulating laver to form first sidewall spacers on the side surfaces of the gate electrode
   vapor depositing a screen layer over the semiconductor substrate, and
   implanting P-type impurities. using the gate electrode and first sidewall spacer as a mask, to form P-type lightly doped implant regions in the semiconductor substrate.

2. The method of claim 1, further comprising:
   depositing a second insulating layer after forming the P-type lightly doped implant regions;
   etching the second insulating layer to form second sidewall spacers on the first insulating sidewall spacers;
   implanting P-type impurities, using the gate electrode and first and second sidewall spacers as a mask, to form P-type moderately or heavily doped implant regions in the semiconductor substrate; and
   activation annealing to form source/drain regions comprising P-type lightly doped and Ptype moderately or heavily doped implants.

3. The method of claim 2, wherein the halo implant regions extend below the gate electrode adjacent to the moderately or heavily doped implants and below the P-type lightly doped implants.

4. The method of claim 1, comprising:
   implanting N-type impurities at an implantation dosage of about $5\times10^{12}$ atoms/cm$^2$ to about $5\times10^{13}$ atoms/cm$^2$ and an implantation energy of about 40 KeV to about 60 KeV to form the halo implant regions.

5. The method of claim 1, comprising:
   implanting P-type impurities at an implantation dosage of about $5\times10^{14}$ atoms/cm$^2$ to about $2\times10^{15}$ atoms/cm$^2$ and an implantation energy of about 10 KeV to about 20 KeV to form the lightly doped implant regions of a P-channel MOSFET.

6. The method of claim 2, comprising:
   implanting P-type impurities at an implantation dosage of about $2\times10^{15}$ atoms/cm$^2$ to about $4\times10^{15}$ atoms/cm$^2$ and an implantation energy of about 20 KeV to about 40 KeV to form the moderately or heavily doped implant regions of a P-channel MOSFET.

7. The method of claim 1, wherein the semiconductor substrate comprises monocrystalline silicon and the dielectric layer comprises silicon oxide.

8. The method of claim 7, wherein the conductive layer comprises doped polycrystalline silicon.

9. A method of manufacturing a CMOS semiconductor device comprising an N-chnnel transistor and a P-channel transistor, which method comprises:
   forming a dielectric layer on a surface of a semiconductor substrate;
   forming a conductive layer on the dielectric layer;
   patterning the conductive layer to form a first gate electrode of the N-channel transistor and a second gate electrode of the P-channel transistor, each gate electrode having an upper surface and side surfaces;
   implanting N-type impurities, using the first gate electrode as a mask, to form N-type lightly doped implant regions of an N-channel transistor in the semiconductor substrate;
   implanting N-type impurities, using the second gate electrode as a mask, at a zero degree tilt angle to form halo implant regions of a P-channel transistor in the semiconductor substrate;
   forming first insulating sidewall spacers on the side surfaces of the first and second gate electrodes;
   implanting impurities, using the first gate electrode and first insulating sidewall spacers as a mask, to form N-type moderately doped or heavily doped implant regions in the semiconductor substrate;

activation annealing at a first temperature to form source/drain regions of the N-channel transistor comprising N-type lightly doped and moderately or heavily doped portions, the lightly doped portions extending below the surface of the semiconductor substrate to a first depth less than a second depth of the N-type moderately or heavily doped portions;

implanting impurities after said N-channel transistor activation step, using the second gate electrode and first insulating sidewall spacers as a mask, to form P-type lightly doped implants in the semiconductor substrate;

forming second insulating sidewall spacers on the first insulating sidewall spacers on the side surfaces of the second gate electrode;

implanting impurities, using the second gate electrode and first and second insulating sidewall spacers thereon as a mask, to form P-type moderately or heavily doped implants in the semiconductor substrate; and activation annealing at a second temperature to form source/drain regions of the P-channel transistor comprising P-type lightly doped and moderately or heavily doped portions, the P-type lightly doped portions extending below the semiconductor substrate to a third depth less than a fourth depth of the P-type moderately or heavily doped portions.

10. The method according to claim 9, wherein the semiconductor substrate comprises monocrystalline silicon and the dielectric layer comprises silicon oxide.

11. The method according to claim 9, wherein the conductive layer comprises doped polycrystalline silicon.

12. The method of claim 9, comprising:
implanting N-type impurities at an implantation of about $5\times10^{12}$ atoms/cm$^2$ to about $5\times10^{13}$ atoms/CM$^2$ and at an implation energy of about 40 KeV to about 60 KeV to form the halo implant regions.

13. The method according to claim 9, comprising ion implanting N-type impurities at a dosage of about $5\times10^{14}$ atoms/cm$^2$ to about $2\times10^{15}$ atoms/CM$^2$ and at an energy of about 10 KeV to about 20 KeV to form the N-type lightly doped implant regions.

14. The method according to claim 9, comprising ion implanting N-type impurities at a dosage of about $3\times10^{15}$ atoms/cm$^2$ to about $6\times10^{15}$ atoms/Cm$^2$ and at an energy of about 30 KeV to about 60 KeV to form the N-type lightly doped implant regions.

15. The method of claim 9, wherein the first and second side wall spacers are each formed by deposition a layer of insulting material etching.

16. The method according to claim 15, wherein the insulating material is a silicon oxide, a silicon nitride or a silicon oxynitride.

17. The method according to claim 9, comprising: implanting phosphorous or arsenic to form the halo implant regions.

18. A method of manufacturing a P-channel CMOS semiconductor device comprising:

forming a dielectric layer on a surface of a semiconductor substrate;

forming a conductive layer on the dielectric layer;

patterning the conductive layer to form a gate electrode having an upper surface and side surfaces;

implanting N-type impurities at a zero degree tilt angle to form halo implant regions in the semidonductor substrate;

depositing a first insulating layer after forming the halo implant regions;

etching the first insulating layer to form first sidewall spacers on the side surfaces of the gate electrode;

implanting P-type impurities, using the gate electrode and first sidewall space as a mask, to form P-type lightly doped implant regions in the semiconductor substrate;

depositing a second insulating layer after forming the P-type lightly doped implant regions;

etching the second insulating layer to form second sidewall spacers on the first insulating sidewall spacers;

vapor depositing a screen layer;

implanting P-type impurities, using the gate electrode and first and second sidewall spacers as a mask, to form P-type moderately or heavily doped implant regions in the semiconductor substrate; and activation annealing to form source/drain regions comprising P-type lightly doped and P-type moderately or heavily doped implants.

* * * * *